US008587081B2

(12) United States Patent  (10) Patent No.: US 8,587,081 B2
Chao  (45) Date of Patent: Nov. 19, 2013

(54) BACK SIDE ILLUMINATED IMAGE SENSOR WITH BACK SIDE PIXEL SUBSTRATE BIAS (76) Inventor: Calvin Yi-Ping Chao, Taipei (TW)

(*) Notice: Subject to any disclaimer, the term of this patent is extended or adjusted under 35 U.S.C. 154(b) by 167 days.

(21) Appl. No.: 12/769,380

(22) Filed: Apr. 28, 2010

(65) Prior Publication Data
US 2011/0266645 A1  Nov. 3, 2011

(51) Int. Cl.
H01L 31/0232 (2006.01)
(52) U.S. Cl.
USPC ............ 257/432; 257/E27.133; 257/E31.127; 438/73
(58) Field of Classification Search
USPC ........... 257/432, E27.133, E31.053, E31.127; 438/73
See application file for complete search history.

(56) References Cited

U.S. PATENT DOCUMENTS

| 7,485,940 | B2 | 2/2009 | Hsu et al. | |
| 7,820,498 | B2* | 10/2010 | Manabe et al. | 438/149 |
| 2002/0117682 | A1 | 8/2002 | Vande Voorde et al. | 257/149 |
| 2002/0153478 | A1* | 10/2002 | Hsin | 250/227.14 |
| 2006/0151848 | A1* | 7/2006 | Rhodes | 257/462 |
| 2007/0241377 | A1* | 10/2007 | Goushcha et al. | 257/292 |
| 2007/0290265 | A1* | 12/2007 | Augusto et al. | 257/351 |
| 2008/0224247 | A1 | 9/2008 | Hsu et al. | |
| 2008/0236662 | A1* | 10/2008 | Ichikawa et al. | 136/256 |
| 2009/0124038 | A1* | 5/2009 | Tuttle | 438/70 |
| 2009/0200588 | A1* | 8/2009 | Manabe et al. | 257/292 |
| 2009/0200625 | A1 | 8/2009 | Venezia et al. | |
| 2010/0096718 | A1 | 4/2010 | Hynecek et al. | |
| 2010/0108893 | A1* | 5/2010 | Flitsch et al. | 250/361 R |
| 2010/0244173 | A1 | 9/2010 | Wang et al. | |
| 2011/0036397 | A1* | 2/2011 | Herner | 136/256 |
| 2011/0058062 | A1* | 3/2011 | Maruyama et al. | 348/222.1 |
| 2011/0223707 | A1* | 9/2011 | Hynecek et al. | 438/70 |
| 2011/0298072 | A1 | 12/2011 | Chuang et al. | |

FOREIGN PATENT DOCUMENTS

CN  101079967  11/2007

OTHER PUBLICATIONS

Wen-De Wang et al., Unpublished U.S. Appl. No. 12/413,752, filed Mar. 30, 2009, "Image Sensor and Method for Fabricating Same", 35 pages.
U.S. Patent Office, U.S. Appl. No. 13/053,607, filed Mar. 22, 2011, titled "Light-Emitting Diode (LED) Package Systems and Methods of Making the Same," 17 pages.
Chinese Patent Office, Office Action dated Oct. 10, 2012, Application No. 201010262565.9, 10 pages.

* cited by examiner

Primary Examiner — Allan R Wilson
(74) Attorney, Agent, or Firm — Haynes and Boone, LLP (57) ABSTRACT Provided is an image sensor device. The image sensor device includes a substrate having a front side and a back side. The image sensor also includes an isolation feature disposed in the substrate. The image sensor further includes a radiation-sensing region disposed in the substrate and adjacent to the isolation feature. The radiation-sensing region is operable to sense radiation projected toward the radiation-sensing region from the back side. The image sensor also includes a transparent conductive layer disposed over the back side of the substrate.

20 Claims, 9 Drawing Sheets

BACK SIDE ILLUMINATED IMAGE SENSOR WITH BACK SIDE PIXEL SUBSTRATE BIAS

FIELD OF THE INVENTION

The present disclosure relates generally to a semiconductor device, and more particularly, to an image sensor device.

BACKGROUND

Semiconductor image sensors are used for sensing light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, that can absorb radiation projected toward the substrate and convert the sensed radiation into electrical signals.

A back side illuminated image sensor (BSI) device is a type of image sensor device. Fabrication of the BSI device typically requires a thinning process that reduces the thickness of the substrate. However, if the substrate is too thin, the BSI device may not be able to absorb radiation efficiently, particularly with respect to radiation that has a long wavelength. In other words, the sensitivity of the BSI device may be degraded as the thickness of the BSI substrate is reduced. On the other hand, if the substrate is not sufficiently thin, cross-talk between neighboring pixels may occur, which reduces image quality. Hence, existing BSI devices may require undesirable tradeoffs between light sensitivity and image quality.

Therefore, while existing methods of fabricating BSI image sensors have been generally adequate for their intended purposes, they have not been entirely satisfactory in every aspect.

SUMMARY

One of the broader forms of the present disclosure involves an image sensor device that includes: a substrate having a front side and a back side; an isolation feature disposed in the substrate; a radiation-sensing region disposed in the substrate and adjacent to the isolation feature, the radiation-sensing region being operable to sense radiation projected toward the radiation-sensing region from the back side; and a transparent conductive layer disposed over the back side of the substrate.

Another of the broader forms of the present disclosure involves an image sensor device that includes: a doped substrate having a front side and a back side; an elongate structure disposed in the substrate, the elongate structure extending substantially from the front side to the back side; a radiation-detecting device disposed in the substrate and beside the elongate structure, the radiation-detecting device being operable to detect radiation waves that enter the substrate through the back side; and a layer disposed over the back side of the substrate, the layer being substantially transparent and substantially conductive.

Still another of the broader forms of the present disclosure involves a method of fabricating an image sensor device, the method includes: providing a substrate having a front side and a back side; forming an isolation feature in the substrate; forming a radiation-sensing region in the substrate and adjacent to the isolation feature, the radiation-sensing region being operable to sense radiation projected toward the radiation-sensing region from the back side; and forming a transparent conductive layer over the back side of the substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
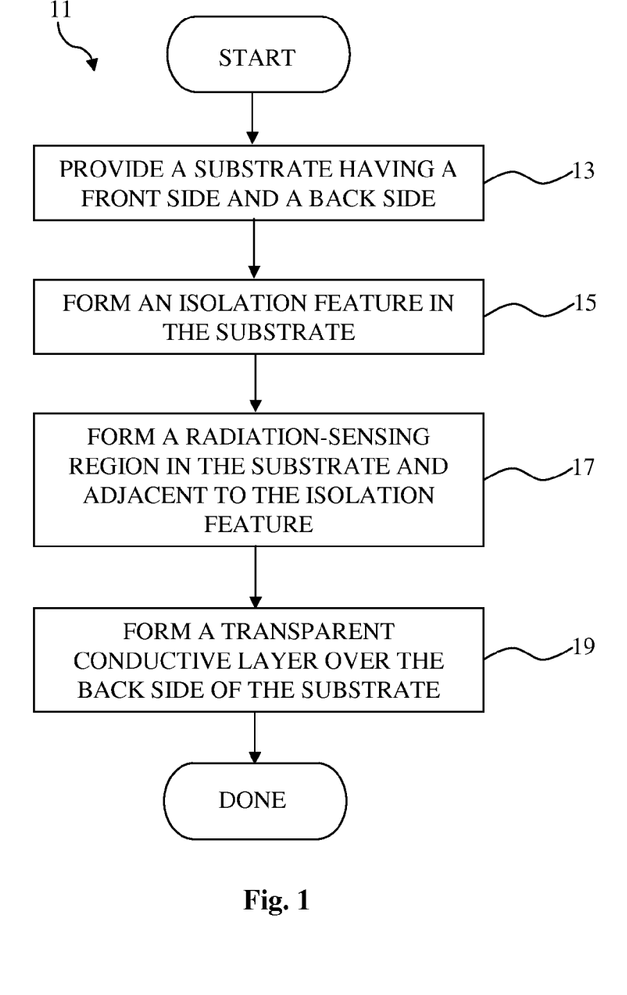
FIG. 1 is a flowchart illustrating a method for fabricating a semiconductor device according to various aspects of the present disclosure.

Illustrated in FIG. 1 is a flowchart of a method 11 for fabricating a back-side illuminated (BSI) image sensor device according to various aspects of the present disclosure. Referring to FIG. 1, the method 11 begins with block 13 in which a substrate having a front side and a back side is provided. The method 11 continues with block 15 in which an isolation feature is formed in the substrate. The method 11 continues with block 17 in which a radiation-sensing region is formed in the substrate. The radiation-sensing region is operable to sense radiation projected toward the radiation-sensing region from the back side. The method 11 continues with block 19 in which a transparent conductive layer is formed over the back side of the substrate.

FIGS. 2 to 7 are diagrammatic fragmentary cross-sectional side views of an apparatus that includes a BSI image sensor device 30 at various stages during its fabrication according to an embodiment of the method 11 of FIG. 1. It is understood that FIGS. 2 to 7 have been simplified for a better understanding of the inventive concepts of the present disclosure.

Figure 2:
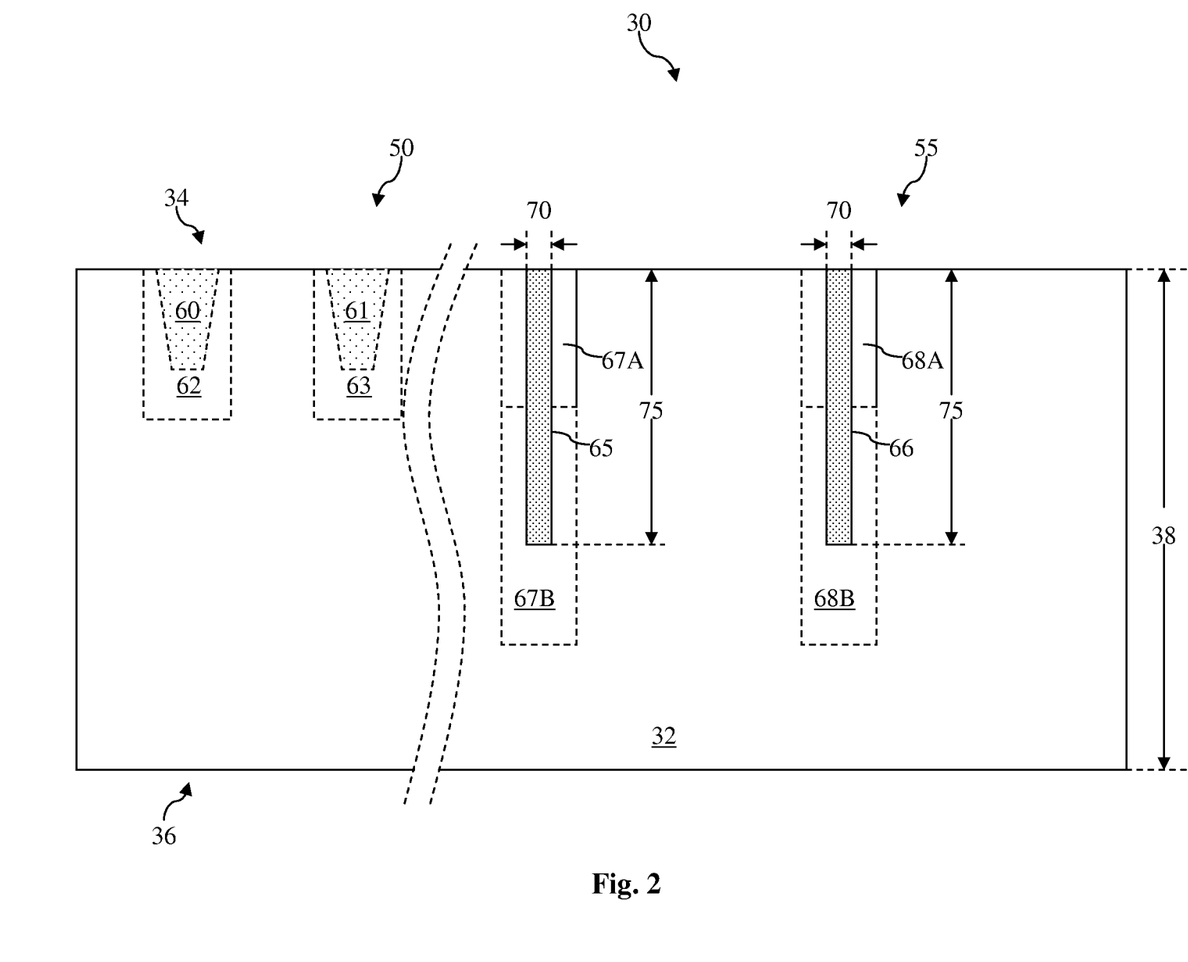
FIGS. 2-7 are diagrammatic fragmentary cross-sectional side views of a semiconductor device at various stages of fabrication in accordance with the method illustrated in FIG. 1.

Referring to FIG. 2, the image sensor device 30 includes a substrate 32, also referred to as a device substrate. The substrate 32 is a silicon substrate doped with a P-type dopant such as boron, in which case the substrate 32 is a P-type substrate. Alternatively, the substrate 32 could be another suitable semiconductor material. For example, the substrate 32 may be a silicon substrate that is doped with an N-type dopant such as phosphorous or arsenic, in which case the substrate 32 is an N-type substrate. The substrate 32 may include other elementary semiconductors such as germanium. The substrate 32 may optionally include a compound semiconductor and/or an alloy semiconductor. Further, the substrate 32 may include an epitaxial layer (epi layer), may be strained for performance enhancement, and may include a silicon-on-insulator (SOI) structure.

The substrate 32 has a front side 34 and a back side 36. The substrate 32 also has an initial thickness 38 that is in a range from approximately 100 microns (um) to approximately 3000 um. In an embodiment, the initial thickness 38 is approximately 700 um.

The substrate 32 includes a periphery region 50 and a pixel-array region 55. The broken curves in FIG. 2 designate an approximate boundary between the periphery region 50 and the pixel-array region 55. The periphery region 50 is a region of the substrate 32 where devices other than radiation-sensing devices will be formed, and the pixel-array region 55 is a region of the substrate 32 where radiation-sensing devices will be formed. This will be discussed later in more detail.

Shallow trench isolation (STI) structures 60 and 61 are formed in the periphery region 50. The STI structures 60 and 61 are formed by etching openings (or trenches) from the front side 34 of the substrate 32 and thereafter filling the openings with a dielectric material, such as an oxide material or a nitride material, or combinations thereof. The STI structure 60 is surrounded by a well 62. The STI structure 61 is surrounded by a well 63. The wells 62-63 have the same doping polarity as the substrate 32. In other words, if the substrate 32 is doped with a P-type dopant, then the wells 62-63 are also doped with a P-type dopant, and vice versa.

Isolation features 65 and 66 are formed in the pixel-array region 55 of the substrate 32. The isolation features 65 and 66 are deep trench isolation structures (or devices). The isolation features 65 and 66 each have an elongated shape, and may have approximately rectangular, trapezoidal, or triangular profiles. The isolation features 65 and 66 each have a width 70 and a depth 75. In an embodiment, the depth 75 is in a range from approximately 2.5 microns (um) to approximately 6 um, and an aspect ratio of the isolation features 65 and 66—defined as the depth 75 divided by the width 70—is in a range from approximately 10 to approximately 100.

The isolation features 65 and 66 are formed by etching openings or trenches in the substrate 32 from the front side 34, for example through a reactive ion etching (RIE) process known in the art, and thereafter filling the openings with a suitable material. This suitable material has a refractive index value that is less than a refractive index value of silicon, which is approximately 4. In other words, the substrate 32 is optically denser than the isolation features 65 and 66. In an embodiment, the isolation features 65 and 66 include silicon oxide, which has a refractive index value of approximately 1.46. In another embodiment, the isolation features 65 and 66 include silicon nitride, which has a refractive index value of approximately 2.05. In yet another embodiment, the isolation features 65 and 66 include air, which has a refractive index value of approximately 1.

The isolation feature 65 is surrounded by a well 67A and a deep well 67B. The isolation feature 66 is surrounded by a well 68A and a deep well 68B. The wells 67A-68A and the deep wells 67B-68B have the same doping polarity as the substrate 32. In other words, if the substrate 32 is doped with a P-type dopant, then the wells 67A-68A and the deep wells 67B-68B are also doped with a P-type dopant, and vice versa.

Figure 3:
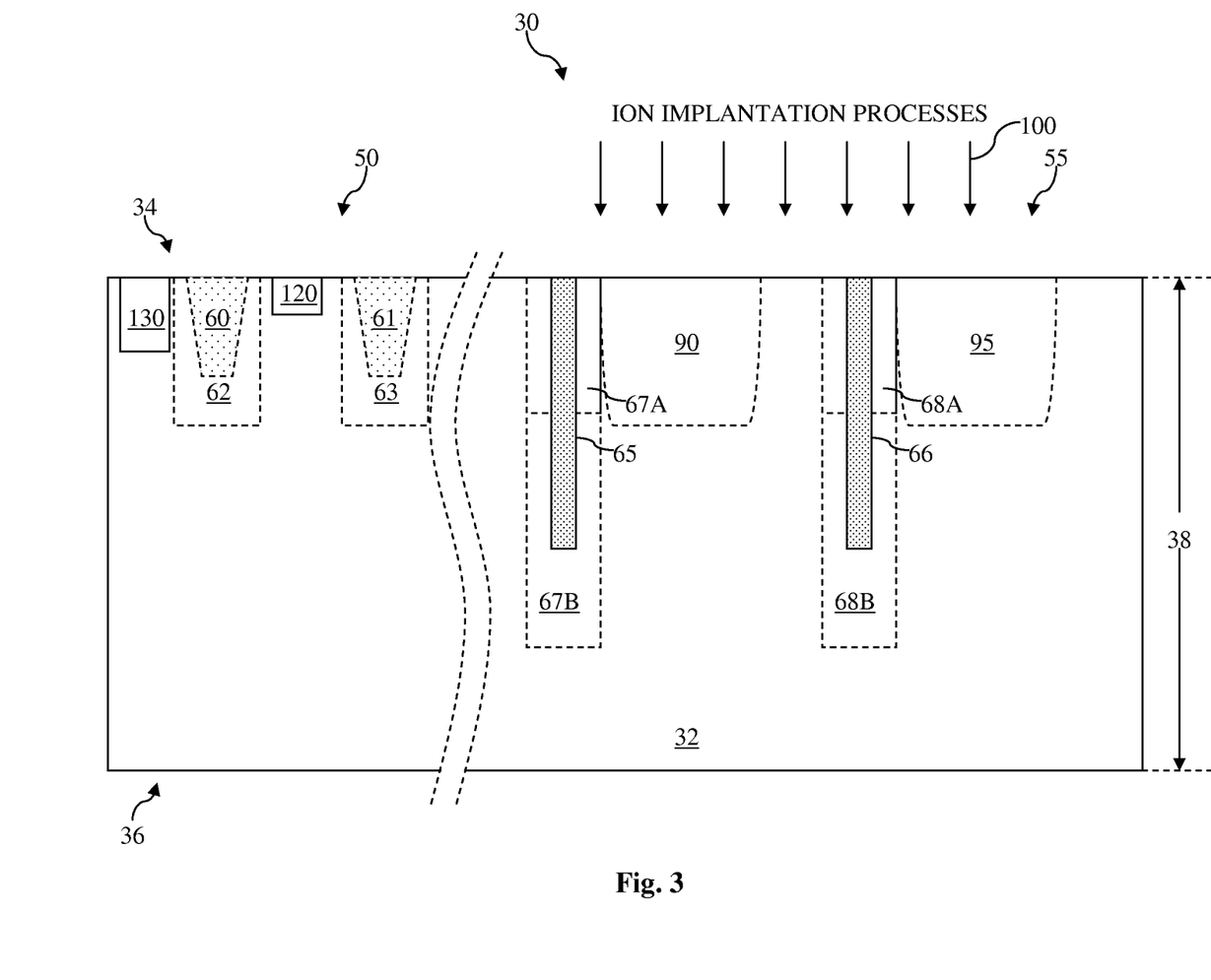

Referring now to FIG. 3, radiation-sensing regions 90 and 95 are formed in the pixel-array region 55 and near the front side 34 of the substrate 32. The radiation-sensing regions 90 and 95 are operable to sense or detect radiation waves projected toward the radiation-sensing regions through the back side 36 of the substrate 32 after the substrate is thinned down (discussed in more detail later) to a proper final thickness. In an embodiment, the radiation-sensing regions 90 and 95 include photodiodes. The photodiodes are typically formed by multiple implant processes using various dopants, implant dosages, and implant energies. For example, N+ implants, array-N-well implants, and deep-array-N-well implants may be performed. The photodiodes may be formed to have a depth of about 1-2 um. The radiation-sensing regions 90 and 95 are isolated from each other (and adjacent radiation-sensing regions that are not illustrated) by the wells 67A-68A and the deep wells 67B-68B.

In other embodiments, the radiation-sensing regions 90 and 95 may include pinned photodiodes (PPD), photogates, reset transistors, source follower transistors, and transfer transistors. For the sake of simplicity, two radiation-sensing regions 90 and 95 are illustrated in FIG. 2, but it is understood that any number of radiation-sensing regions may be formed in the substrate 32 to implement the image sensor device 30.

The radiation-sensing regions 90 and 95 are formed by performing a plurality of ion implantation processes 100 on the substrate 32 through the front side 34. The ion implantation processes 100 include multiple implant steps and may use different dopants, implant dosages, and implantation energies. The ion implantation processes 100 may also use different masks that have different patterns and opening sizes. In an embodiment, the ion implantation processes 100 include doping the substrate 32 with a dopant having an opposite doping polarity as the substrate 32.

In addition, although not illustrated for the sake of simplicity, transistor devices may be formed in the pixel-array region 55. For example, a metal-oxide-semiconductor field-effect transistor (MOSFET) device may be formed adjacent to the radiation-sensing region 90. The MOSFET device may have a gate, a source, and a drain. The gate may be formed over the front side 34 of the substrate 32. The source and the drain may be formed in the substrate 32 near the front side 34 and on either side of the gate. The source may be coupled to the radiation-sensing region 90. The gate and the drain may be coupled to external devices through vias or contacts of an interconnect structure that will be discussed later.

The radiation-sensing regions 90 and 95 may each be part of a pixel of the image sensor device 30, where the boundaries of the pixels may be defined by isolation features such as the isolation features 65, 66 and wells 67A, 67B, 68A, and 68B. In operation, electrical or optical cross-talk may occur, which may degrade the performance of the pixels and the image sensor device. For example, electrical cross-talk occurs when charge carriers from one pixel spread/diffuse into neighboring pixels. As another example, optical cross-talk occurs when photons from the radiation waves that are intended to be received by one pixel end up being received by an unintended pixel, for example a neighboring pixel. The embodiments discussed herein are capable of reducing cross-talk, as discussed in more detail below.

Still referring to FIG. 3, a circuit substrate pickup device 120 is formed at the front side 34 of the periphery region 50 of the substrate. The circuit substrate pickup device 120 is typically a heavily doped implant region, for example a heavily doped P+ type implant region in the present embodiment. The circuit substrate pickup device 120 may be coupled to external devices through vias, contacts, and metal wires (not illustrated) so that the periphery region 50 of the substrate 32 is biased to a desired voltage or grounded. The periphery region 50 also includes circuitry 130, the details of which are not illustrated for the sake of simplicity. The circuitry 130 may be circuitry of the image sensor device 30 that needs to be kept optically dark. For example, the circuitry 130 may include a digital device, such as an application-specific integrated circuit (ASIC) device or a system-on-chip (SOC) device. The circuitry 130 may also include a reference pixel that is used to establish a baseline of an intensity of radiation (such as light) for the image sensor device 30.

Although not illustrated for the sake of simplicity, the image sensor device 30 may include a complimentary metal oxide semiconductor (CMOS) image sensor (CIS), an active-pixel sensor (APS), or a passive-pixel sensor. The image sensor device 30 may further include additional circuitry and input/outputs that are provided adjacent to the pixels for providing an operation environment for the pixels and for supporting external communication with the pixels.

Figure 4:
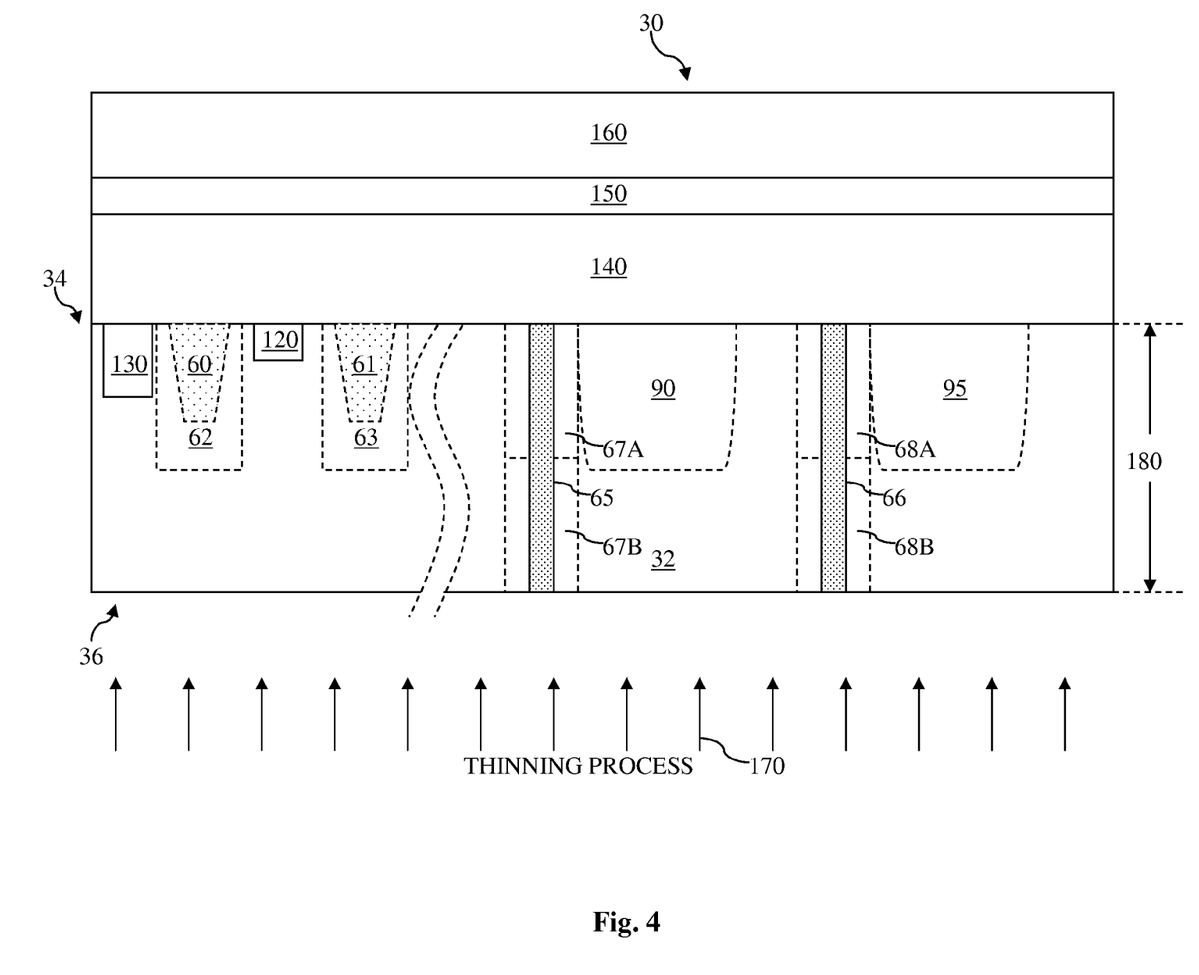

Referring now to FIG. 4, an interconnect structure 140 is formed over the front side 34 of the substrate 32. The interconnect structure 140 includes a plurality of patterned dielectric layers and conductive layers that provide interconnections (e.g., wiring) between the various doped features, circuitry, and input/output of the image sensor device 30. The interconnect structure 140 includes an interlayer dielectric (ILD) and a multilayer interconnect (MLI) structure formed in a configuration such that the ILD separates and isolates each MLI structure from other MLI structures. The MLI structure includes contacts, vias and metal lines formed on the substrate 32.

In one example, the MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

A buffer layer 150 is formed on the interconnect structure 140. In the present embodiment, the buffer layer 150 includes a dielectric material such as silicon oxide. Alternatively, the buffer layer 150 may optionally include silicon nitride. The buffer layer 150 is formed by CVD, PVD, or other suitable techniques. The buffer layer 150 is planarized to form a smooth surface by a chemical-mechanical-polishing (CMP) process.

A carrier substrate 160 is then bonded with the buffer layer 150 so that processing of the back side 36 of the substrate 32 can be performed. The carrier substrate 160 is bonded to the buffer layer 150 by molecular forces. The carrier substrate 160 may be similar to the substrate 32 and includes a silicon material. Alternatively, the carrier substrate 160 may optionally include a glass substrate. The carrier substrate 160 provides protection for the various features formed on the front side 34 of the substrate 32. The carrier substrate 160 also provides mechanical strength and support for processing the back side 36 of the substrate 32, which will be discussed below. It is understood that an annealing process may be performed to enhance bonding strength. The buffer layer 150 provides electrical isolation between the substrate 32 and the carrier substrate 160.

Thereafter, a thinning process 170 is performed to thin the substrate 32 from the back side 36. In an embodiment, the thinning process 170 includes a CMP process. The thinning process 170 may also include a diamond scrubbing process, a grinding process, or other suitable techniques. A substantial amount of substrate material may be removed from the substrate 32 during the process 170.

After process 170 is performed, the substrate 32 has a thickness 180, which is in a range from approximately 3 um to approximately 6 um. The thickness 180 is greater than a thickness for a thinned substrate of existing BSI image sensors, which is typically around 2.5 um. The thickness 180 allows more efficient absorption of radiation compared with existing BSI sensors, particularly with respect to radiation having a relatively long wavelength, such as wavelengths that are greater than 550 nanometers (nm). This will be discussed in more detail later.

Figure 5:
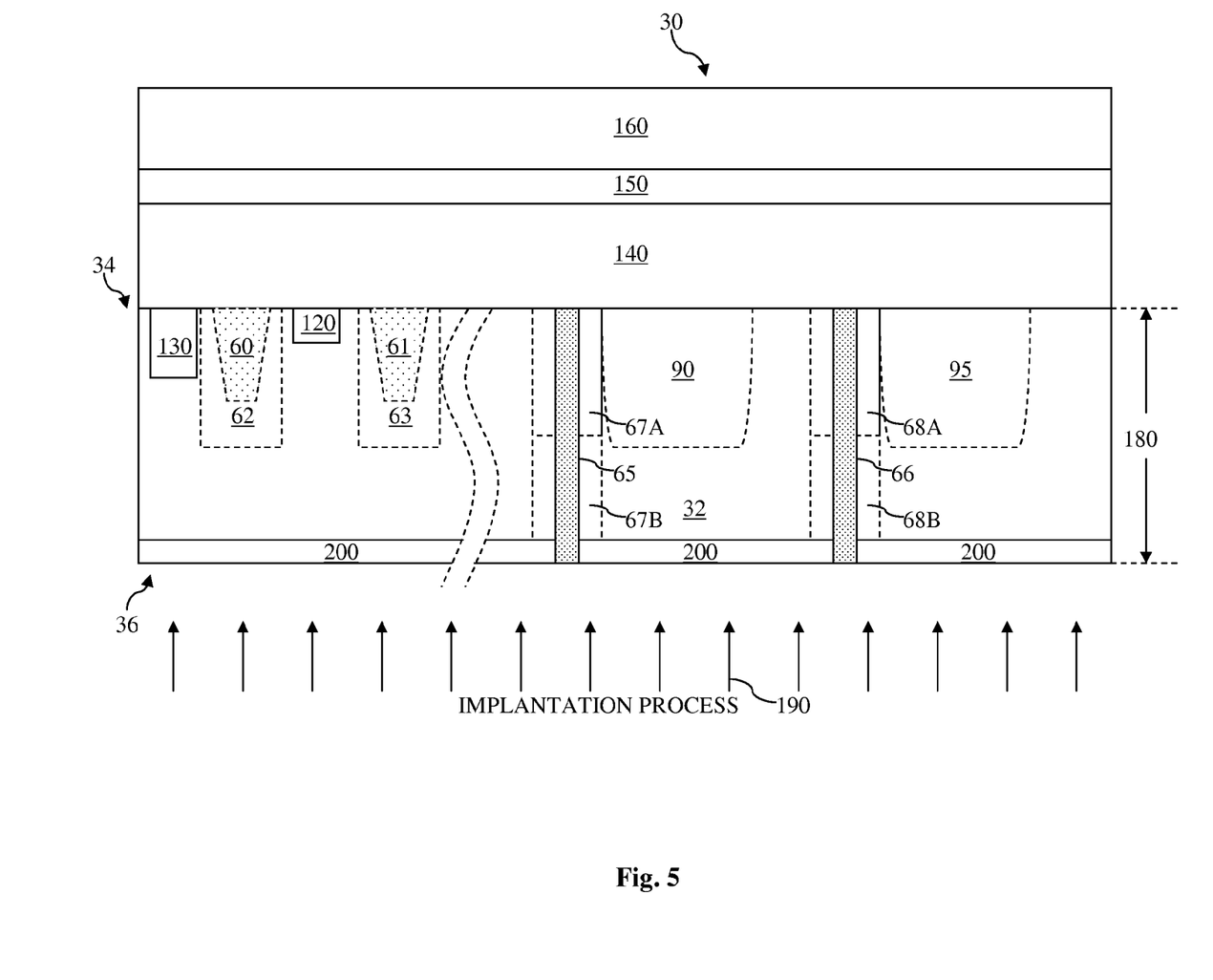

Referring now to FIG. 5, an implantation process 190 is performed on the back side 36 of the substrate 32 to form a passivation layer 200 at the back side of the substrate. The implantation process 190 implants dopants of the same doping polarity (or type) as the substrate 32, although with a heavier doping concentration, into regions of the substrate 32 at the back side 36, to form the passivation layer 200. For example, in an embodiment where the substrate 32 is a P-type substrate, the passivation layer 200 includes P-type dopants that are more heavily concentrated than the P-type dopants in the substrate 32.

The passivation layer 200 helps make the back side 36 of the substrate 32 more smooth, particularly since the thinning process 170 (FIG. 4) may involve process steps that result in a relatively rough surface on the back side 36 prior to the forming of the passivation layer 200. The passivation layer 200 also provides a sealing function for the various features and devices of the image sensor device 30, so that they are less likely to be eroded or damaged by external devices. A laser annealing process may also be optionally performed.

Figure 6:
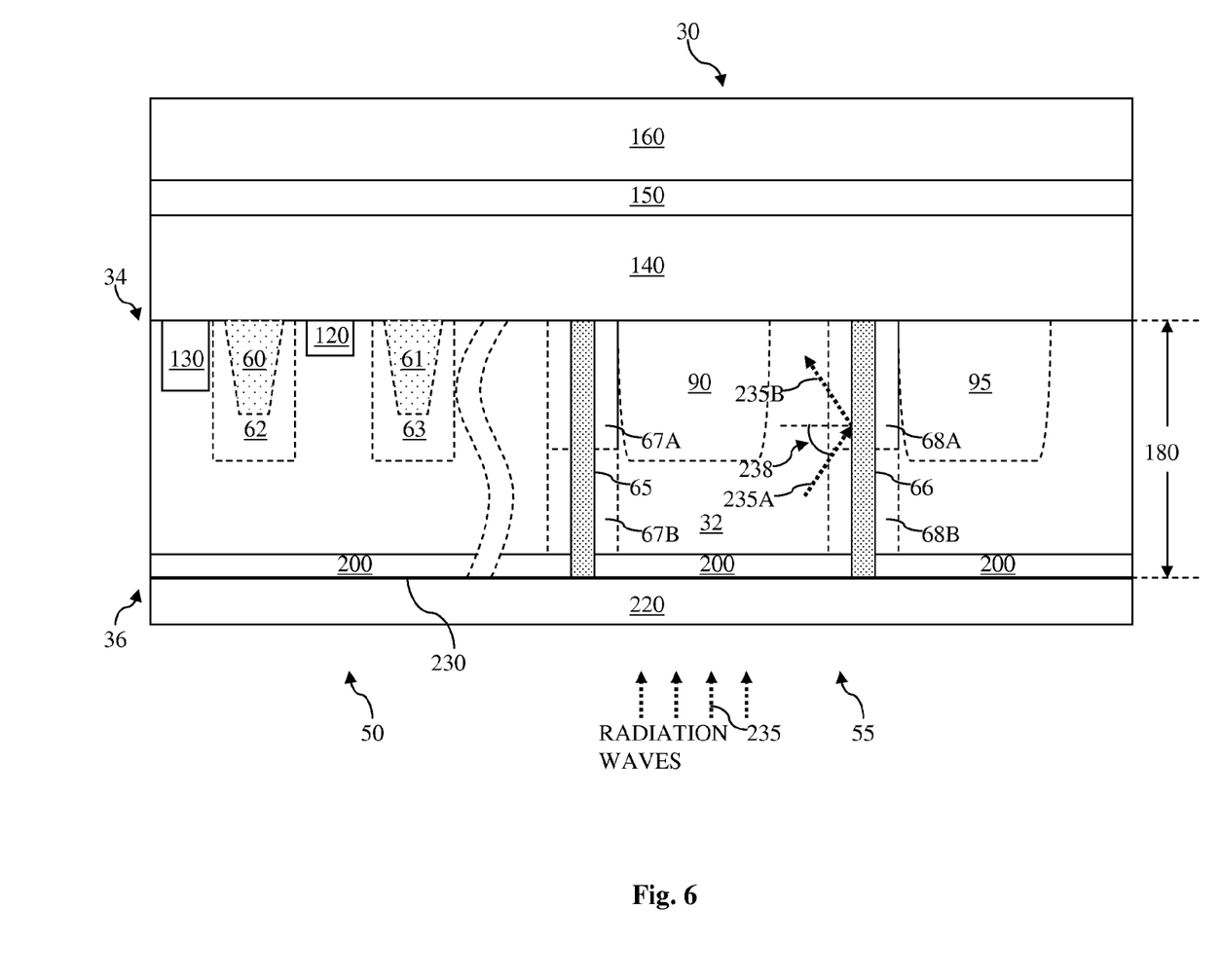

Referring now to FIG. 6, a layer 220 is formed over the back side 36 of the substrate 32. The layer 220 is formed by a sputtering process known in the art and is substantially transparent and substantially conductive. The degree of transparency and degree of conductivity of the layer 220 are measured by a transmission rate of radiation in a visible spectrum and a sheet resistance, respectively. In an embodiment, the layer 220 includes an indium-tin-oxide material. In another embodiment, the layer 220 includes another suitable material having a transmission rate of radiation in a visible spectrum that is greater than approximately 90%, and a sheet resistance that is less than approximately 10 ohms/square.

The passivation layer 200 and the layer 220 form an interface 230. The interface 230 constitutes an Ohmic contact, meaning its current-voltage (UV) curve is substantially linear and symmetric. This is partly due to the fact that the passivation layer 200 is heavily doped and that the layer 220 has a relatively low sheet resistance.

The layer 220 provides grounding for the pixel-array region 55 of the substrate 32. In the embodiment illustrated in FIGS. 2-6, the isolation features 65 and 66 completely separate the periphery region 50 of the substrate 32 from the pixel-array region 55 of the substrate 32. Thus, without the layer 220, the pixel-array region would be electrically "floating" even if the periphery region is electrically grounded. Also as discussed above, the isolation features such as the isolation features 65 and 66 divide the pixel-array region 55 of the substrate 32 into pixels. These pixels are electrically isolated from neighboring or adjacent pixels due to the fact that the isolation features 60 and 65 substantially extend from the front side 34 to the back side 36 of the substrate 32. As such, without the conductive layer 220, one or more pixels may be electrically floating even if other pixels are electrically grounded. It is understood that in some embodiments, an electrical contact and a substrate pickup device similar to the circuit substrate pick up device 120 may be added to each pixel.

Electrically floating pixels may interfere with the operation of an image sensor device. For example, the pixel-array region 55 of the substrate 32 needs to be firmly grounded for the radiation-sensing regions 90 and 95 to be reset. Other problems associated with electrically floating pixels may include reduced sensitivity of the image sensor device.

One existing technique of dealing with the floating pixel issue is to form shorter isolation structures to separate the pixels. In other words, these shorter isolation structures do not extend substantially from the front side to the back side of the substrate. As an example, existing techniques may form STI structures as the shorter isolation structures. In this fashion, the different regions of the substrate (and the pixels) are not completely electrically isolated, and that each pixel can be firmly grounded.

However, one problem associated with the above approach is that since the STI structures are shallow, they may not effectively reduce the electrical cross-talk between neighboring pixels, since the charge carriers from one pixel can easily diffuse into a neighboring pixel by diffusing underneath (or around) the STI structures. The relatively short trench depth of the STI structures associated with this approach means that this approach may also suffer from optical cross-talk, since photons of the radiation waves may not encounter the STI barrier before they end up in an unintended neighboring pixel.

To address the cross-talk issue, some techniques have included a different thinning process so that the thickness of the substrate is reduced to a thinner level compared to the present disclosure. For example, some existing techniques may require that the substrate be thinned to be less than approximately 2 um. At this level, the STI structures may be capable of sufficiently reducing electrical and optical cross-talk. However, a substrate this thin may have reduced radiation absorption capabilities, as a radiation absorption rate is positively correlated with the thickness of the absorbing material (the substrate). A more detailed chart and discussion of the correlatively relationship between the substrate thickness and the radiation absorption rate will be provided later.

Thus, existing techniques involve an undesirable tradeoff between cross-talk and sensitivity. Such trade-off is eliminated by the various embodiments of the present disclosure. Here, the layer 220 is highly conductive and couples together the periphery region 50 and the pixel-array region 55, as well as the various pixels within the pixel-array region 55. As such, the layer 220 provides electrical grounding to all the pixels and solves the floating pixel issue discussed above. Further, the present disclosure allows deep trench isolation structures to be used as the isolation features 65 and 66, thus substantially reducing electrical and optical cross-talk problems. In addition, the present disclosure involves thinning the substrate down to a level that is still deep enough for the sufficient absorption of radiation waves, even for radiation waves having relatively long wavelengths. As such, the sensitivity of the image sensor device 30 is not sacrificed. Moreover, since the layer 220 is substantially transparent, it would not interfere with the projection and propagation of radiation waves such as light toward the radiation-sensing regions 90 and 95 from the back side 36 of the substrate 32.

The isolation features 65 and 66 also help reduce electrical and optical cross-talk. For example, radiation waves 235 are projected toward the back side 36 to be sensed by the radiation sensing regions 90 and 95. A portion of the radiation waves 235 may propagate within the substrate 32 as light 235A. The light 235A forms an incident angle 238 with the isolation feature 66. Since the refractive index value of the substrate 32 is larger than the refractive index value of the isolation feature 66, a portion of the light 235A will be reflected as light 235B when the light 235A reaches the interface between the substrate 32 and the isolation feature 66.

This light reflection reduces optical cross-talk. The percentage of the reflected light 235B varies depending on the incident angle 238 and a ratio of the two refractive index values. If the incident angle 238 becomes larger than a critical angle $\theta_c$, total internal reflection occurs, meaning that 100% of the light 235A will be reflected as light 235B, thus eliminating optical cross-talk. $\theta_c$ is defined using the following equation:

$$\theta_c = \arcsin(\text{refractive index value of the isolation feature 66/refractive index value of the substrate 32})$$

Furthermore, the isolation features 65 and 66 also prevent charge carriers from one pixel from diffusing into neighboring pixels, thus reducing electrical cross-talk.

Thus, some of the advantages of the embodiments disclosed herein are outlined above. However, it is understood that other embodiments may offer different advantages, and that no particular advantage is required for any embodiment.

Figure 7:
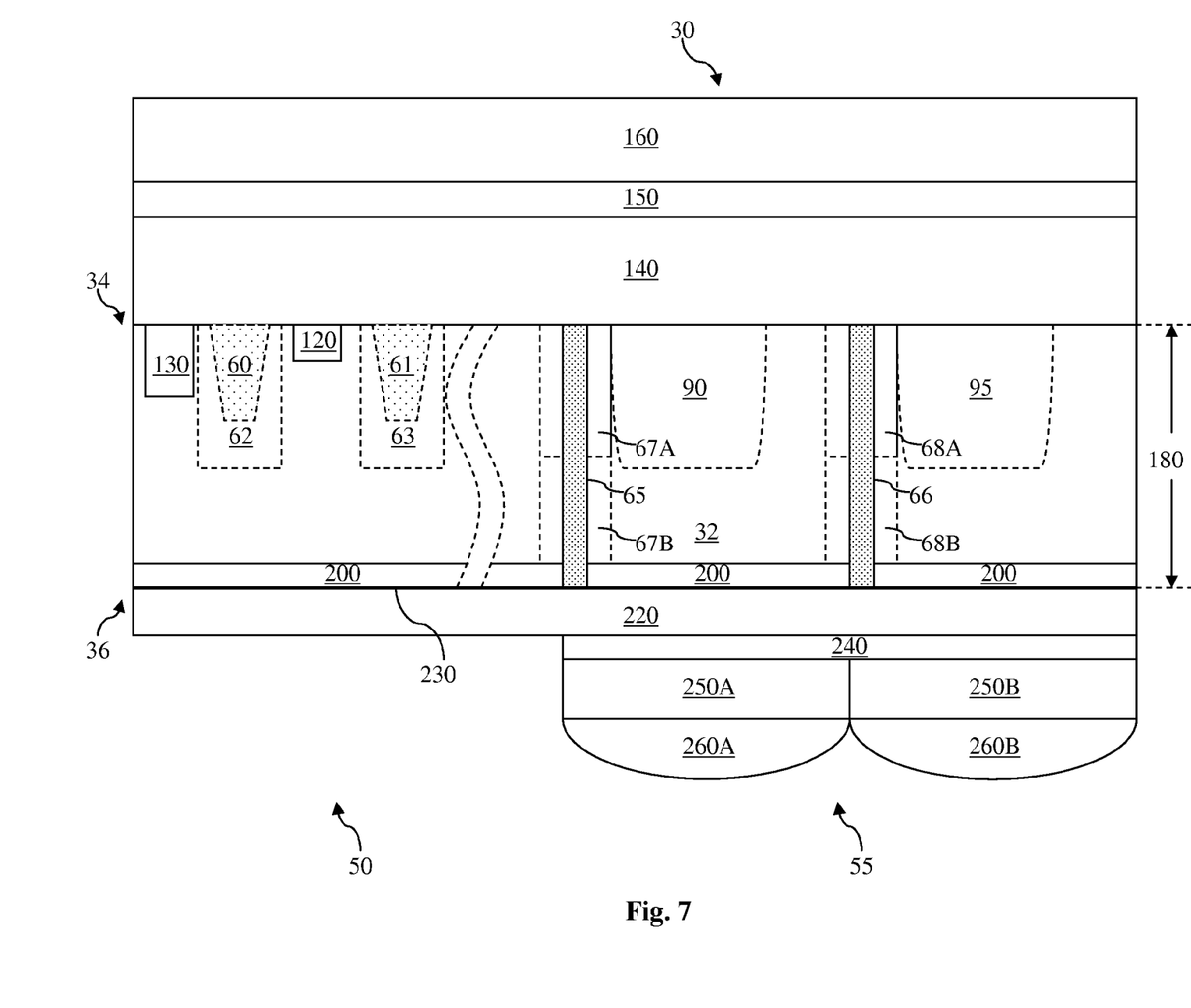

Referring now to FIG. 7, an anti-reflective layer 240 is formed over the pixel-array region 55. The anti-reflective layer 240 serves to reduce reflection of radiation waves projected toward the back side 36. Thereafter, color filters 250A and 250B are formed over the anti-reflective layer 240. The color filters 250A and 250B can support the filtering of radiation waves having different wavelengths, which may correspond to different colors, such as primary colors including red, green, and blue, or complementary colors including cyan, yellow, and magenta. The color filters 250A and 250B may also be positioned such that the incident light radiation is directed thereon and there through. For example, the color filter 250A may filter the incident radiation such that only red light reaches the radiation-sensing region 90. The color filter 250B may filter the incident radiation such that only green light reaches the radiation-sensing region 95. The color filters 250A and 250B may include a dye-based (or pigment based) polymer or resin to achieve the filtering of specific wavelength bands.

After the color filters 250A and 250B are formed, micro lenses 260A and 260B are formed over the color filters 250A and 250B for directing radiation toward the radiation-sensing regions 90 and 95. The micro lenses 260A and 260B may be positioned in various arrangements and have various shapes depending on a refractive index of material used for the micro-lenses and distance from the surface of the image sensor device 30.

Figure 8:
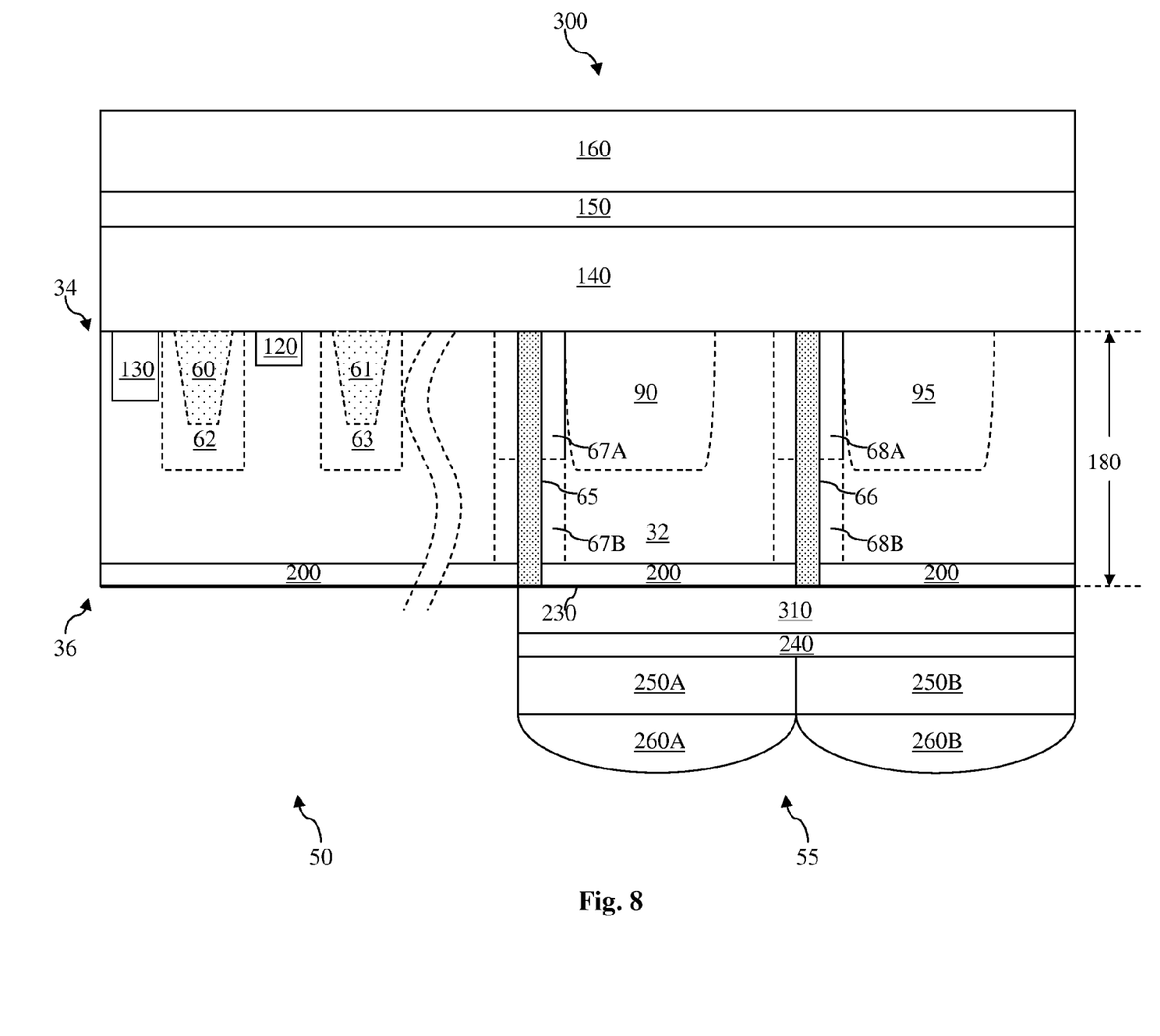
FIG. 8 is diagrammatic fragmentary cross-sectional side view of a semiconductor device at a stage of fabrication in accordance with an alternative embodiment of the method illustrated in FIG. 1.

FIG. 8 is a diagrammatic fragmentary cross-sectional side view of an image sensor device 300 that is fabricated in accordance with an alternative embodiment of the method 11 of FIG. 1. For the sake of consistency and simplicity, similar devices and features from FIGS. 2-7 are labeled the same in FIG. 8. One difference between the image sensor device 300 and the image sensor device 30 is that instead of the layer 220, the image sensor device 300 includes a layer 310 that is substantially transparent and substantially conductive.

Unlike the layer 220, the layer 310 is formed over the pixel-array region 55 of the substrate 32 and not over the periphery region 50 of the substrate. As such, the pixel-array region 55 and the periphery region 50 can be biased to different voltages.

As an example, the periphery region 50 can be electrically grounded by coupling the circuit substrate pickup device 120 to ground. Meanwhile, the pixel-array region 55 can be biased to a negative voltage by coupling the layer 310 to a voltage source. The negative voltage may vary depending on design requirements, for example in a range from approximately −0.5 volt to approximately −1.5 volts in one embodiment. This negative bias may allow the radiation-sensing regions 90 and 95 to have greater sensitivity and thus may enhance the performance of the image sensor device 300.

Figure 9:
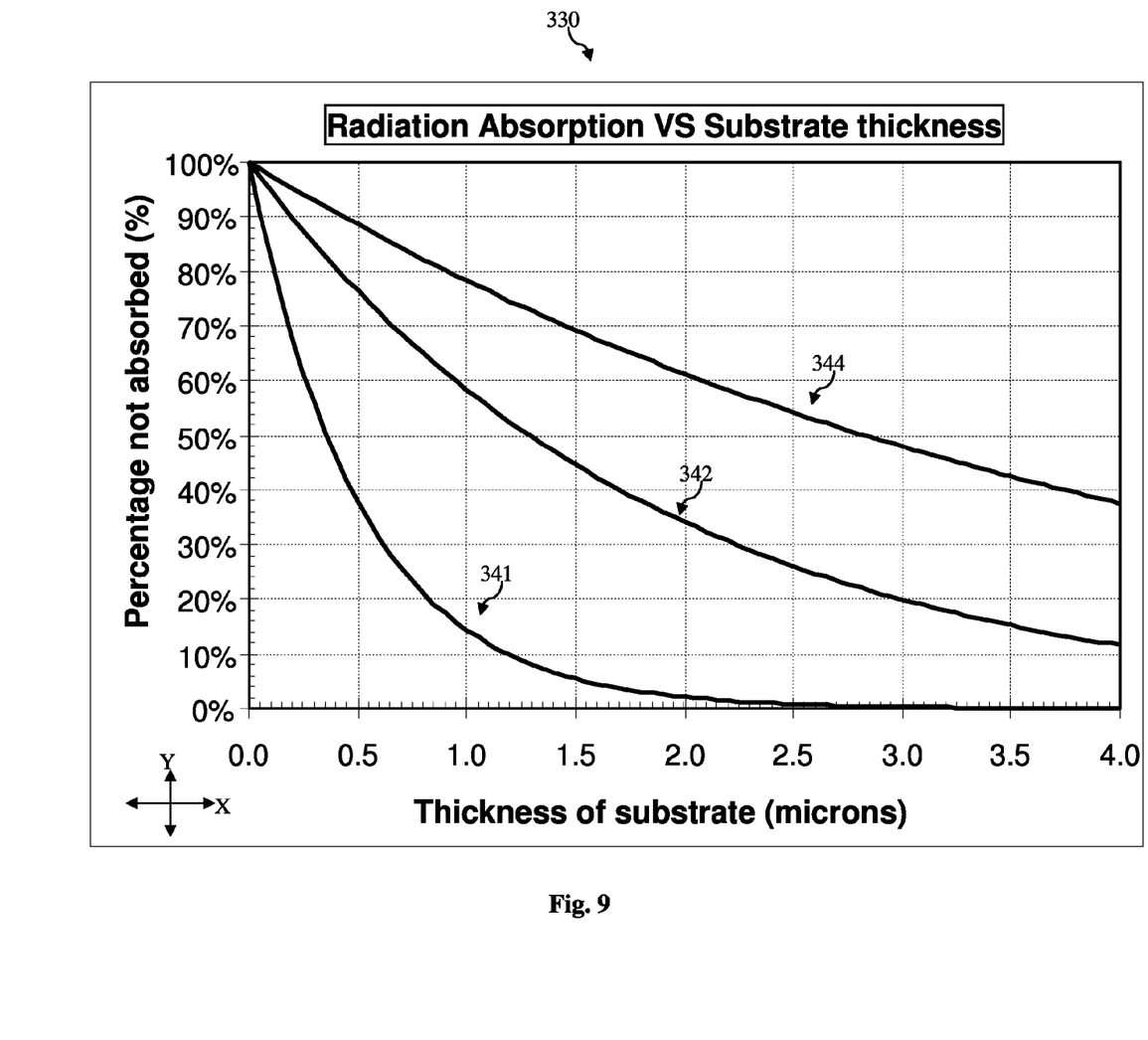
FIG. 9 is a chart illustrating a graph that shows a relationship between the thickness of a substrate and its rate of radiation absorption.

FIG. 9 is a graphical chart 330 illustrating a relationship between a rate of radiation absorption and a thickness of the substrate (made of a silicon material in the present embodiment) that absorbs the radiation. For example, the thickness of the radiation-absorbing substrate may be the thickness 180 (FIGS. 4-8) of the thinned substrate 32. The thickness of the radiation-absorbing substrate is measured in microns and forms the X-axis of the chart 330. The rate of radiation absorption is measured by the percentage of radiation that is actually not absorbed, which forms the Y-axis of the chart 330. In other words, as the thickness of the radiation-absorbing substrate increases (moving to the right along the X-axis), the rate of radiation absorption improves, which translates to a decrease of the percentage of radiation not absorbed (moving downwards along the Y-axis).

The chart 330 shows three curves 341, 342, and 344 that are respective datasets of radiation having different wavelengths. In particular, the curve 341 is a dataset of radiation having a wavelength of approximately 450 nm, which corresponds to blue light. The curve 342 is a dataset of radiation having a wavelength of approximately 550 nm, which corresponds to green light. The curve 344 is a dataset of radiation having a wavelength of approximately 650 nm, which corresponds to red light.

At a given substrate thickness, the rate of radiation absorption decreases as the wavelength of the radiation increases. For example, with a 2-um substrate thickness, the percentage of radiation not absorbed is approximately 3% for the blue light (curve 341), approximately 35% for the green light (curve 342), and approximately 62% for the red light (curve 344). Alternatively stated, the blue, green, and red lights have respective absorption rates of approximately 38%, 46%, and 97% with a 2 um thick substrate.

As discussed above, BSI image sensor devices fabricated with existing techniques typically have a substrate thickness of approximately 2 um. From the chart 330, it can be seen that a significant amount of red and green light is not absorbed by the existing BSI image sensor devices. In comparison, the image sensor device 30 (FIGS. 2-7) or the image sensor device 300 (FIG. 8) have thicker substrates, for example substrates that are 4-um thick. In that case, according to the chart 330, the red light would have an absorption rate of approximately 63%, the green light would have an absorption rate of approximately 88%, and the blue light would have an absorption rate of approximately 100%. Thus, the rates of radiation absorption of the image sensor devices 30 and 300 are substantially improved over existing BSI image sensor devices.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An image sensor device, comprising:
   a substrate having a front side and a back side, wherein the substrate contains a pixel-array region and a non-pixel-array region, the pixel-array region including a well;
   an isolation feature disposed within the well in the pixel-array region of the substrate;
   a radiation-sensing region disposed in the pixel-array region of the substrate and adjacent to the isolation feature, the radiation-sensing region being configured to sense radiation projected toward the radiation-sensing region from the back side; and
   a transparent conductive layer disposed over both the pixel-array region and the non-pixel-array region and on the back side of the substrate, and
   wherein the substrate includes a doped layer disposed proximate the back side, and wherein the transparent conductive layer is disposed on the doped layer.

2. The image sensor device of claim 1, wherein the radiation-sensing region is disposed proximate the front side of the substrate, and wherein the isolation feature is a deep trench isolation that extends substantially from the front side to the back side of the substrate.

3. The image sensor device of claim 1, wherein the radiation-sensing region is doped with a dopant of a first type, and the doped layer is doped with a dopant of a second type that is opposite the first type.

4. The image sensor device of claim 1, wherein the transparent conductive layer includes an indium-tin-oxide material.

5. The image sensor device of claim 1, wherein the substrate has a thickness that is in a range from approximately 2.5 microns to approximately 6 microns.

6. The image sensor device of claim 1, wherein the non-pixel-array region contains circuitry that is configured to be kept optically dark.

7. The image sensor of claim 1, wherein the isolation feature disposed within the well in the pixel-array region of the substrate is a dielectric isolation feature.

8. The image sensor of claim 7, wherein the dielectric isolation feature extends through a portion of the doped layer.

9. An image sensor device, comprising:
   a doped substrate having a front side and a back side, wherein the substrate includes a pixel-array region and a periphery region, wherein the substrate includes a material having a dopant type at a first concentration at the front side of the substrate;
   an elongate structure disposed in the pixel-array region of the substrate, the elongate structure extending substantially from the front side to the back side;
   a radiation-detecting device disposed in the pixel-array region of the substrate and beside the elongate structure, the radiation-detecting device being configured to detect radiation waves that enter the substrate through the back side;
   a passivation layer formed at the back side of the substrate and formed of the material having the dopant type at a second concentration that is greater than the first concentration; and a layer disposed over both the pixel-array region and the periphery region and on the back side of the substrate, the layer being substantially transparent and substantially conductive.

10. The image sensor device of claim 9, wherein the elongate structure includes a deep trench isolation having one of a dielectric material and air, and the radiation-detecting device includes a photo diode.

11. The image sensor device of claim 9, wherein the passivation layer forms an interface with the transparent conductive layer, and wherein a doping concentration of the passivation layer is within a range such that the interface is substantially conductive.

12. The image sensor device of claim 9, wherein the radiation waves include one of green light and red light, and wherein the substrate has a thickness that corresponds to one of:
- an absorption rate between approximately 88% and approximately 100% for the green light; and
- an absorption rate between approximately 63% and approximately 100% for the red light.

13. The image sensor device of claim 9, wherein the layer includes an indium-tin-oxide material; and wherein the elongate structure has a refractive index value that is greater than a refractive index value of the doped substrate; and further including:
- an interconnect structure disposed over the front side of the substrate; and
- a color filter and a micro lens disposed over the back side of the substrate.

14. The image sensor device of claim 9, wherein the periphery region contains circuitry that is configured to be kept optically dark.

15. A method of fabricating an image sensor device, comprising:
- providing a substrate having a front side and a back side, wherein the substrate contains a pixel-array region and a non-pixel-array region;
- forming an isolation feature in the pixel-array region of the substrate, wherein the isolation feature is disposed within a well in the pixel-array region;
- forming a radiation-sensing region in the pixel-array region of the substrate and adjacent to the isolation feature, the radiation-sensing region being configured to sense radiation projected toward the radiation-sensing region from the back side;
- forming a transparent conductive layer over both the pixel-array region and the non-pixel-array region and on the back side of the substrate; and
- forming a doped layer proximate the back side of the substrate before the forming the transparent conductive layer.

16. The method of claim 15, wherein the forming the radiation-sensing region is carried out so that the radiation-sensing region is disposed near the front side of the substrate, and wherein the forming the isolation feature is carried out so that the deep trench isolation extends substantially from the front side to the back side of the substrate.

17. The method of claim 15, wherein the forming the radiation-sensing region is carried out so that the radiation-sensing region includes a dopant of a first type, and the forming the doped layer is carried out so that the doped layer includes a dopant of a second type that is opposite the first type.

18. The method of claim 15, wherein the forming the transparent conductive layer is carried out so that the transparent conductive layer includes indium-tin-oxide.

19. The method of claim 15, further including, before the forming the transparent conductive layer, thinning the substrate in a manner so that the substrate has a thickness that is in a range from approximately 3 microns to approximately 6 microns after the thinning.

20. The method of claim 15, further including:
- applying a first voltage to the periphery region; and
- applying a second voltage to the transparent conductive layer, the second voltage being different from the first voltage.

* * * * *